United States Patent
Takahashi

(10) Patent No.: US 8,866,407 B2
(45) Date of Patent: Oct. 21, 2014

(54) LIGHTING DEVICE

(75) Inventor: Kei Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 474 days.

(21) Appl. No.: 13/213,395

(22) Filed: Aug. 19, 2011

(65) Prior Publication Data

US 2012/0043911 A1 Feb. 23, 2012

(30) Foreign Application Priority Data

Aug. 20, 2010 (JP) ................................ 2010-184846

(51) Int. Cl.
| | | |
|---|---|---|
| H05B 39/04 | (2006.01) | |
| H05B 37/00 | (2006.01) | |
| G09G 3/20 | (2006.01) | |
| G09G 3/34 | (2006.01) | |
| H01L 51/50 | (2006.01) | |
| H05B 37/02 | (2006.01) | |

(52) U.S. Cl.
CPC . *G09G 3/20* (2013.01); *Y02B 20/42* (2013.01); *G09G 3/34* (2013.01); *H01L 51/50* (2013.01); *H05B 37/02* (2013.01)
USPC .......................................... 315/294; 315/312

(58) Field of Classification Search
USPC ...... 315/224, 185 R, 291, 307, 308, 312, 294
See application file for complete search history.

(56) References Cited

U.S. PATENT DOCUMENTS

| | | | |
|---|---|---|---|
| 6,459,594 B1 | 10/2002 | Tsuji et al. | |
| 6,483,731 B1 | 11/2002 | Isurin et al. | |
| 7,023,141 B2 | 4/2006 | Anzai et al. | |
| 7,088,321 B1* | 8/2006 | Parker | 345/83 |
| 7,221,338 B2 | 5/2007 | Yamazaki et al. | |
| 7,245,297 B2 | 7/2007 | Kimura et al. | |
| 7,276,856 B2 | 10/2007 | Anzai et al. | |
| 7,369,143 B2 | 5/2008 | Koyama | |
| 7,542,018 B2 | 6/2009 | Anzai et al. | |
| 7,592,991 B2 | 9/2009 | Anzai et al. | |
| 7,623,098 B2 | 11/2009 | Yamazaki et al. | |
| 7,635,863 B2 | 12/2009 | Yamazaki et al. | |
| 2007/0013321 A1* | 1/2007 | Ito et al. | 315/247 |
| 2007/0296353 A1* | 12/2007 | Ito et al. | 315/307 |
| 2008/0001512 A1 | 1/2008 | Nomura | |
| 2008/0094009 A1 | 4/2008 | Koyama et al. | |
| 2009/0128045 A1* | 5/2009 | Szczeszynski et al. | 315/185 R |
| 2009/0295306 A1 | 12/2009 | Sasaki | |
| 2009/0302776 A1* | 12/2009 | Szczeszynski | 315/246 |
| 2010/0148697 A1* | 6/2010 | Bayat et al. | 315/294 |

FOREIGN PATENT DOCUMENTS

| | | |
|---|---|---|
| JP | 11-272223 | 10/1999 |
| JP | 2003-323159 | 11/2003 |

* cited by examiner

*Primary Examiner* — Minh D A
(74) *Attorney, Agent, or Firm* — Husch Blackwell LLP

(57) ABSTRACT

A lighting device whose power conversion efficiency is improved by suppression of fluctuation in luminance of a light-emitting element and deterioration of the light-emitting element due to a change in temperature and a change over time and whose power consumption is reduced is provided. The disclosed invention is a lighting device that has a function of correcting a change in temperature and a change over time and includes at least one switching regulator in a driver portion. Constant current drive is performed on light-emitting elements and monitor light-emitting elements are used, so that highly-efficient output voltage which is corrected to have an optimal level is applied to the light-emitting elements and stable drive is performed for a long time. Power conversion efficiency is improved by a switching regulator, so that the total power consumption of the lighting device is reduced.

36 Claims, 10 Drawing Sheets

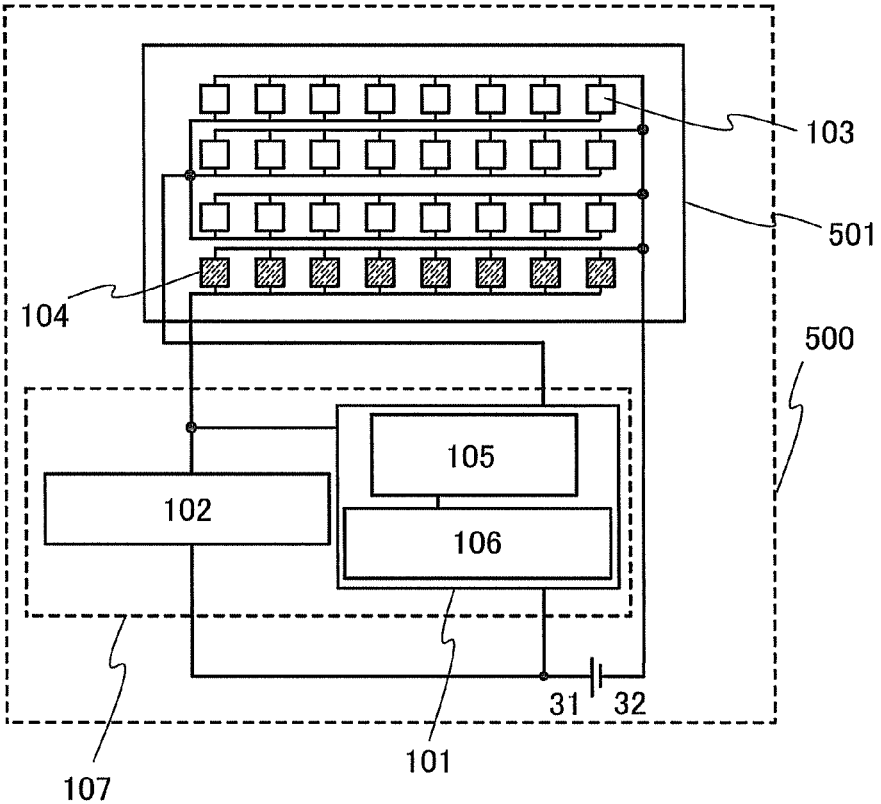
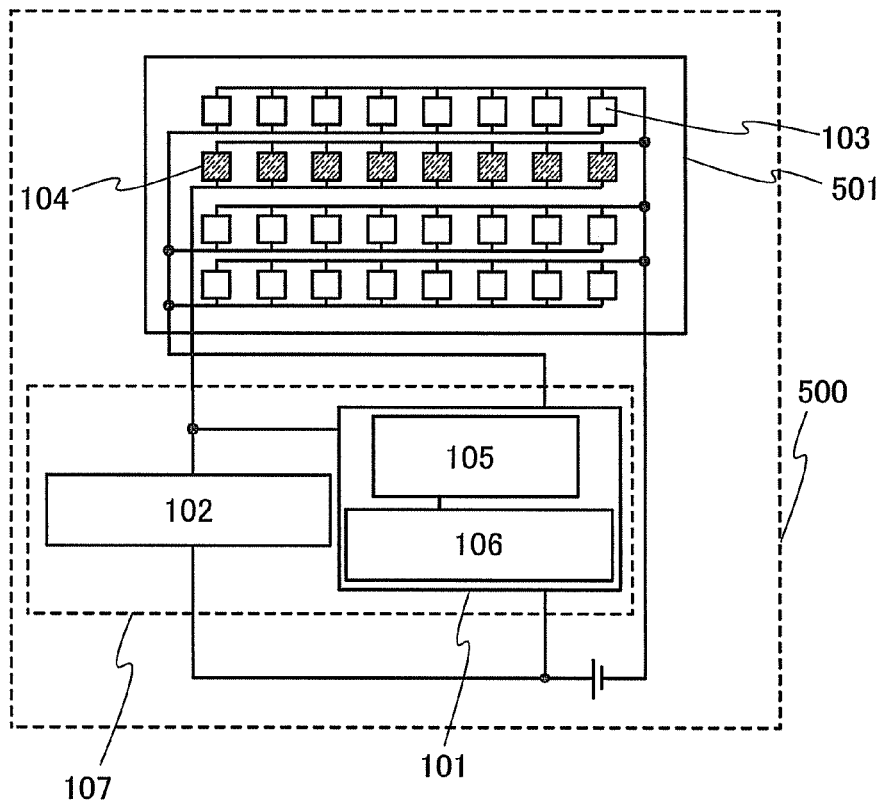

LIGHTING DEVICE

BACKGROUND OF THE INVENTION

1. Field of the Invention

The disclosed invention relates to lighting devices including light-emitting elements, and display devices and electronic devices including lighting devices.

2. Description of the Related Art

In recent years, display devices and lighting devices that include light-emitting elements typified by organic EL (electroluminescence) elements emitting light at a luminance of 100 to 1000 cd/m$^2$ have been developed. Broader applications have been expected by taking advantages of high image quality due to self emission, wide viewing angle, small thickness, lightweight, and the like. In particular, applications of organic EL elements to lighting equipment have been actively progressed. However, the life of organic EL elements and the emission efficiency of the organic EL elements decrease with a change over time. Thus, more improvement in luminance and more suppression of deterioration have been needed.

The resistance of light-emitting elements increases and the luminance of the light-emitting elements fluctuates as time passes. In Reference 1, fluctuation in luminance is suppressed by constant-current drive of a light-emitting element. Concerning deterioration of light-emitting elements, stable drive at high temperature for a long time tends to be emphasized. Even when ambient temperature is room temperature, the temperature of light-emitting elements is raised by generation of heat due to internal resistance at the time of being driven; thus, the light-emitting elements need endurance at high temperature.

As a circuit for converting input voltage into desired output voltage, a linear regulator and a switching regulator are known. The switching regulator obtains voltage at a desire level in such a manner that voltage with a pulse waveform is formed from input voltage by a switching element and the voltage is smoothed or held in a coil, a capacitor, or the like. In such a regulator, a slight increase in conversion efficiency is directly linked to a reduction in power consumption. Thus, development of a technique for performing efficient control is needed.

REFERENCE

Reference 1: Japanese Published Patent Application No. 2003-323159

SUMMARY OF THE INVENTION

Linear regulators have an advantage that noise is not easily generated; however, they have a disadvantage that internal power loss is not easily reduced in principle because desire output voltage is generated when input voltage is consumed using the on-resistance of elements. Thus, conversion efficiency is low and the amount of heat generation associated with power loss is increased. Further, input current which is equivalent to output current is needed; thus, power consumption is increased with the increase in dark current.

In addition, the luminance of the light-emitting elements varies with a change in temperature or a change over time because of the characteristics of the light-emitting elements. Thus, in a lighting device, it is difficult to perform stable drive with uniform luminance in a plane and reduce power consumption even though luminance can be controlled locally, which is problematic.

In view of the problems, it is an object of one embodiment of the present invention to provide a lighting device whose power conversion efficiency is improved by reduction of the influence of on-resistance loss of elements and whose power consumption is reduced. It is an object of one embodiment of the present invention to provide a lighting device which performs stable drive with high accuracy by suppression of fluctuation in luminance of a light-emitting element and deterioration of the light-emitting element due to a change in temperature and a change over time.

The disclosed invention is a lighting device that has a function of correcting a change in temperature and a change over time and includes at least one switching regulator in a driver portion.

One embodiment of the present invention is a lighting device which includes a light-emitting element, a monitor light-emitting element, a constant current circuit for performing constant current drive on the light-emitting element and the monitor light-emitting element, and a voltage control switching regulator for detecting voltage generated in the monitor light-emitting element and outputting voltage that is substantially the same as the voltage. One terminal of the light-emitting element and an output terminal of the voltage control switching regulator are electrically connected to each other. One terminal of the monitor light-emitting element and the constant current circuit are electrically connected to each other.

One embodiment of the present invention is a lighting device which includes a light-emitting element, a monitor light-emitting element, a current control switching regulator for performing constant current drive on the light-emitting element and the monitor light-emitting element, and a voltage control switching regulator for detecting voltage generated in the monitor light-emitting element and outputting voltage that is substantially the same as the generated voltage. One terminal of the light-emitting element and an output terminal of the voltage control switching regulator are electrically connected to each other. One terminal of the monitor light-emitting element and an output terminal of the current control switching regulator are electrically connected to each other.

In one embodiment of the present invention, an input terminal of the voltage control switching regulator and the constant current circuit may be electrically connected to a wiring for supplying a high power supply potential.

In one embodiment of the present invention, an input terminal of the voltage control switching regulator and an input terminal of the current control switching regulator may be electrically connected to a wiring for supplying a high power supply potential.

In one embodiment of the present invention, the other terminal of the light-emitting element and the other terminal of the monitor light-emitting element may be electrically connected to a wiring for supplying a low power supply potential.

In one embodiment of the present invention, a plurality of the light-emitting elements are provided.

In one embodiment of the present invention, a plurality of the monitor light-emitting elements are provided.

In one embodiment of the present invention, the number of monitor light-emitting elements is smaller than the number of light-emitting elements.

In one embodiment of the present invention, the light-emitting element and the monitor light-emitting element are formed over one substrate.

In one embodiment of the present invention, the light-emitting element and the monitor light-emitting element may be EL elements.

In one embodiment of the present invention, the light-emitting elements may be connected to each other in parallel and the monitor light-emitting elements may be connected to each other in parallel.

In one embodiment of the present invention, the light-emitting elements may be connected to each other in series and the monitor light-emitting elements may be connected to each other in series.

One embodiment of the present invention is a display device including any one of the lighting devices in a display portion.

One embodiment of the present invention is an electronic device including any one of the lighting devices in a display portion.

Note that in this specification and the like, terms such as "terminal" and "wiring" do not limit the functions of components. For example, a "terminal" can be used as part of a "wiring", and the "wiring" can be used as part of the "terminal". The terms such as "terminal" and "wiring" can also mean a combination of a plurality of "terminals" and a plurality of "wirings", for example.

Functions of a "source" and a "drain" might interchange when a transistor of opposite polarity is used or the direction of current flow is changed in circuit operation, for example. Thus, in this specification, the terms "source" and "drain" can interchange.

Note that in this specification and the like, the term "electrically connected" includes the case where components are connected to each other through an object having any electric function. Here, there is no particular limitation on an object having any electric function as long as electric signals can be transmitted and received between components that are connected to each other through the object.

Examples of an "object having any electric function" include a switching element such as a transistor, a resistor, an inductor, a capacitor, and an element with a variety of functions in addition to an electrode and a wiring.

According to one embodiment of the present invention, a lighting device whose power conversion efficiency is improved and whose power consumption is reduced can be obtained. Further, a lighting device which performs stable drive with high accuracy can be obtained.

BRIEF DESCRIPTION OF THE DRAWINGS

In the accompanying drawings:

FIGS. 7A and 7B are circuit diagrams each illustrating a structure of a lighting device of an embodiment;

DETAILED DESCRIPTION OF THE INVENTION

Figure 1:
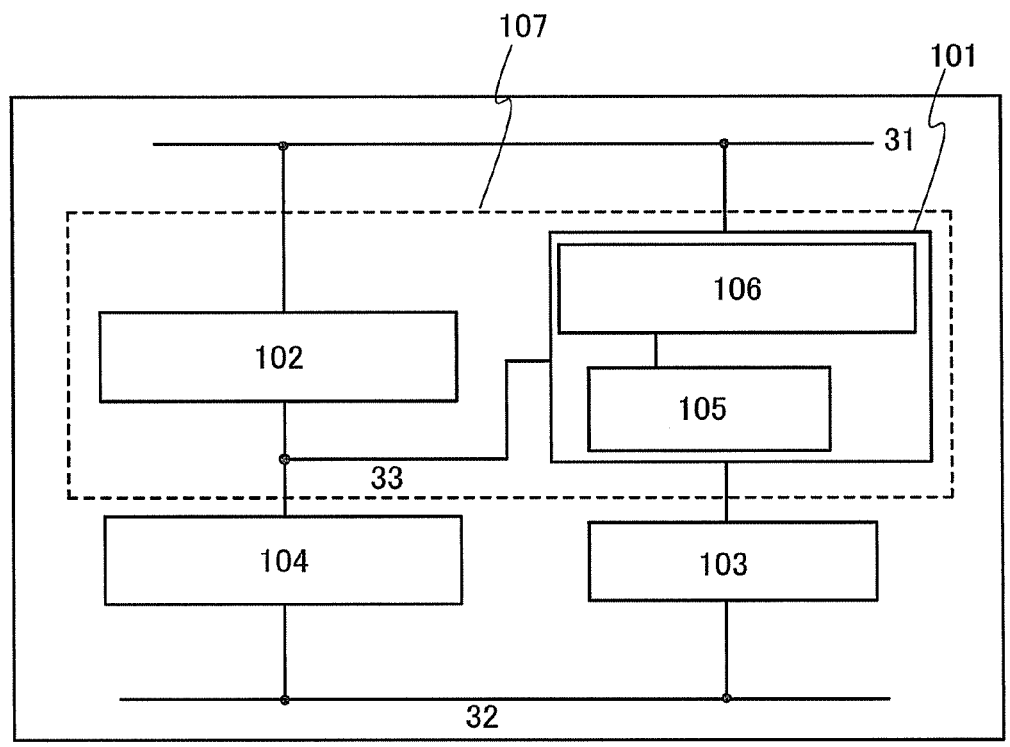
FIG. 1 is a circuit diagram illustrating a structure of a lighting device of an embodiment.

Examples of embodiments of the present invention will be described below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that the position, size, range, or the like of each component illustrated in drawings and the like is not accurately represented in some cases for easy understanding. The disclosed invention is therefore not necessarily limited to the position, size, range, or the like disclosed in the drawings and the like.

Note that in this specification and the like, ordinal numbers such as "first", "second", and "third" are used in order to avoid confusion among components and do not limit the number of components.

Embodiment 1

In this embodiment, circuit structures and operation of a lighting device according to one embodiment of the disclosed invention are described with reference to FIG. 1, FIGS. 2A and 2B, and FIG. 3.

A lighting device 100 illustrated in FIG. 1 includes a driver portion 107 that includes a voltage control switching regulator 101 and a constant current circuit 102, a light-emitting element 103, and a monitor light-emitting element 104.

A first power supply line 31 is electrically connected to an input terminal of the voltage control switching regulator 101 and the constant current circuit 102. One terminal of the light-emitting element 103 is electrically connected to an output terminal of the voltage control switching regulator 101. The other terminal of the light-emitting element 103 is electrically connected to a second power supply line 32. One terminal of the monitor light-emitting element 104 is electrically connected to the constant current circuit 102 and a third power supply line 33. The other terminal of the monitor light-emitting element 104 is electrically connected to the second power supply line 32. High power supply voltage $V_{DD}$ is applied to the first power supply line 31, and low power supply voltage $V_{SS}$ is applied to the second power supply line 32. Voltage Vel that is corrected to have an optimal level with a change in voltage of both the terminals of the monitor light-emitting element 104 is applied to the third power supply line 33. Note that here, fixed voltage such as GND is applied as the low power supply voltage $V_{SS}$ for simplification of description; however, this embodiment is not limited to this example.

Here, in the case where current flows through the monitor light-emitting element 104 when the constant current circuit 102 is electrically connected to the one terminal of the monitor light-emitting element 104, the value of the current is kept constant. However, the temperature of the monitor light-emitting element 104 is changed over time. The constant current circuit 102 can supply fixed stable current regardless of a change in temperature; thus, the voltage between both the terminals of the monitor light-emitting element 104 is changed while the value of current flowing through the monitor light-emitting element 104 is not changed. Specifically, the voltage of the other terminal of the monitor light-emitting element 104 is the fixed voltage and is not changed, so that the voltage of the one terminal of the monitor light-emitting element 104 is changed. The third power supply line 33 can detect this change and can apply the voltage that is corrected to have an optimal level to the voltage control switching regulator 101. Thus, fluctuation in luminance of a light-emitting element and deterioration of the light-emitting element due to a change in temperature and a change over time can be suppressed, so that stable drive can be performed with high accuracy for a long time.

Next, the voltage control switching regulator 101 provided in the lighting device 100 illustrated in FIG. 1 is described with reference to FIGS. 2A and 2B. The voltage control switching regulator 101 includes an output voltage control circuit 106 and a power converter circuit 105 that generates fixed voltage (output voltage) with the use of voltage (input voltage) applied to an input terminal IN and outputs the output voltage from an output terminal OUT.

The power converter circuit 105 includes a transistor 301 that functions as a switching element and a constant voltage generation portion 302. When the transistor 301 is on, input voltage is supplied to the constant voltage generation portion 302. When the transistor 301 is off, the supply of input voltage to the constant voltage generation portion 302 is stopped. In addition, when the transistor is off, fixed voltage such as GND is applied to the constant voltage generation portion 302. Thus, in response to switching of the transistor 301, a pulse signal in which input voltage and fixed voltage are alternated is supplied to the constant voltage generation portion 302.

The constant voltage generation portion 302 includes a diode 303, a coil 304, and a capacitor 305. The constant voltage generation portion 302 generates fixed output voltage by smoothing or holding the voltage of a pulse signal after the signal is supplied.

The output voltage control circuit 106 controls the ratio of on time to off time of the transistor 301. By control of the ratio of on time to off time, a ratio between a period when a pulse is generated and a period when a pulse signal is supplied to the constant voltage generation portion 302 (hereinafter such a ratio is referred to as a duty ratio) can be controlled. When the duty ratio is changed, output voltage is also changed. Specifically, the increase in percentage of periods when pulses of input voltage are generated leads to the increase in difference between output voltage and fixed voltage. In contrast, the decrease in percentage of periods when pulses of input voltage are generated leads to the decrease in difference between output voltage and fixed voltage.

Switching of the transistor 301 can be controlled by voltage Vgs between a gate terminal and a source terminal of the transistor 301. The output voltage control circuit 106 controls a change in voltage Vgs over time so that the ratio of on time to off time of the transistor 301 is controlled.

The specific circuit structure and operation of the voltage control switching regulator 101 are described below with reference to FIGS. 2A and 2B. A step-up regulator with which high output voltage can be obtained with respect to input voltage and a step-down regulator with which low output voltage can be obtained with respect to input voltage are separately described. Note that the voltage control switching regulator 101 in this embodiment may have either structure.

Figure 2A:
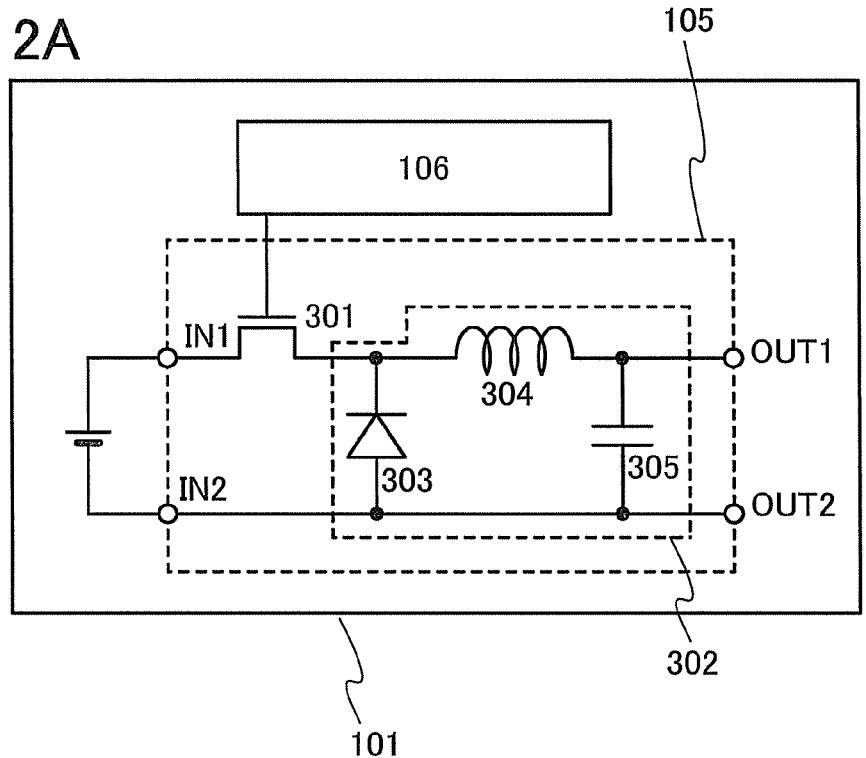
FIGS. 2A and 2B are circuit diagrams each illustrating a structure of a lighting device of the embodiment.

FIG. 2A illustrates the step-down voltage control switching regulator 101. The voltage control switching regulator 101 illustrated in FIG. 2A includes the output voltage control circuit 106, the transistor 301, and the constant voltage generation portion 302. Further, the voltage control switching regulator 101 illustrated in FIG. 2A includes an input terminal IN1 supplied with input voltage, an input terminal IN2 supplied with fixed voltage, an output terminal OUT1, and an output terminal OUT2.

A first terminal of the transistor 301 is electrically connected to the input terminal IN1. One terminal of the coil 304 is electrically connected to a cathode of the diode 303 and a second terminal of the transistor 301. The other terminal of the coil 304 is electrically connected to the output terminal OUT1 of the voltage control switching regulator 101 and one terminal of the capacitor 305. The input terminal IN2 is electrically connected to an anode of the diode 303, the output terminal OUT2, and the other terminal of the capacitor 305. Note that the transistor 301 controls connection between the input terminal IN1 and the cathode of the diode 303.

In the voltage control switching regulator 101 illustrated in FIG. 2A, a potential difference is generated between the input terminal IN1 and the output terminal OUT1 when the transistor 301 is turned on, so that current flows through the coil 304 and energy is stored. The coil 304 is magnetized by the current flow, and electromotive force is generated by self induction in a direction opposite to the direction of current flow. Thus, voltage which is obtained by a decrease in input voltage supplied to the input terminal IN1 is supplied to the output terminal OUT1. In other words, between the pair of terminals of the capacitor 305, voltage corresponding to a difference between fixed voltage supplied from the input terminal IN2 and the voltage obtained by the decrease in the input voltage is applied.

Then, when the transistor 301 is turned off, a current path formed between the input terminal IN1 and the output terminal OUT1 is blocked. The coil 304 releases the stored energy and generates electromotive force in a direction in which the change in current is blocked, that is, a direction which is opposite to the direction of electromotive force generated at the time when the transistor 301 is on. Thus, the current flowing through the coil 304 is held by voltage generated by the electromotive force. In other words, when the transistor 301 is off, a current path is formed between the output terminal OUT1 and the input terminal IN2 or the output terminal OUT2 through the diode 303 and the coil 304. Accordingly, voltage applied between the pair of terminals of the capacitor 305 is held to some extent.

Note that voltage held in the capacitor 305 corresponds to voltage output from the output terminal OUT1. In the above operation, as a percentage of on time of the transistor 301 becomes higher, the voltage held in the capacitor 305 becomes closer to a difference between the fixed voltage and the input voltage. Thus, the voltage can be decreased so that output voltage whose level is closer to the level of the input voltage is obtained. In contrast, as a percentage of off time of the transistor 301 becomes higher, a difference between the fixed voltage and the voltage held in the capacitor 305 becomes smaller. Accordingly, the voltage can be decreased so that output voltage whose level is closer to the level of the fixed voltage is obtained.

Figure 2B:
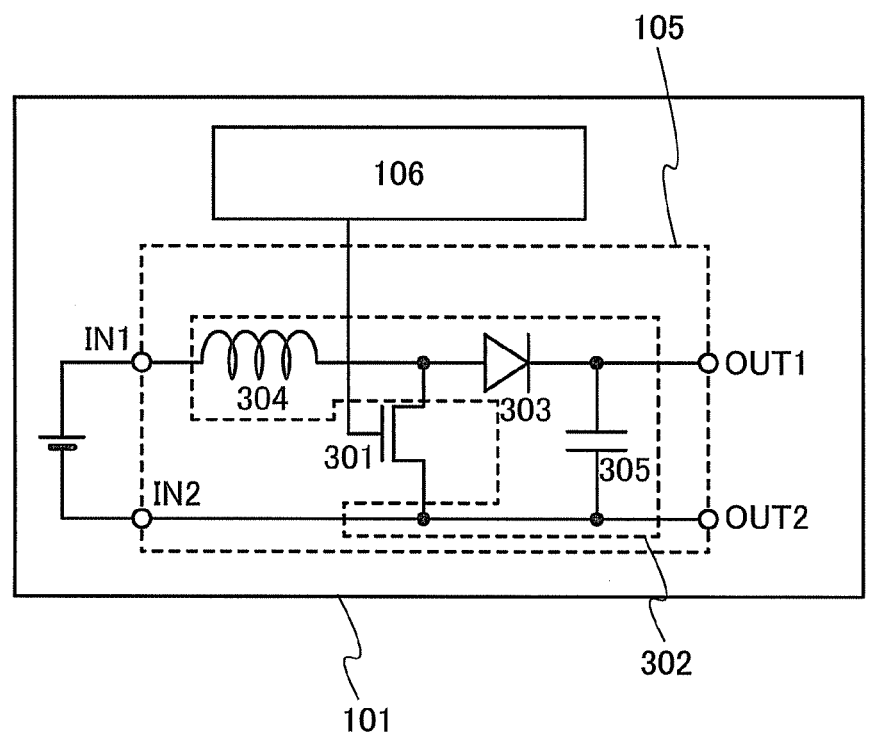

FIG. 2B illustrates the step-up voltage control switching regulator 101. The voltage control switching regulator 101 illustrated in FIG. 2B includes the output voltage control circuit 106, the transistor 301, and the constant voltage generation portion 302. Further, the voltage control switching regulator 101 illustrated in FIG. 2B includes the input terminal IN1 supplied with input voltage, the input terminal IN2 supplied with fixed voltage, the output terminal OUT1, and the output terminal OUT2.

The one terminal of the coil 304 is electrically connected to the input terminal IN1. The first terminal of the transistor 301 is electrically connected to the other terminal of the coil 304 and the anode of the diode 303. The second terminal of the transistor 301 is electrically connected to the input terminal IN2 or the output terminal OUT2. The one terminal of the capacitor 305, the cathode of the diode 303, and the output terminal OUT1 are electrically connected to each other. The other terminal of the capacitor 305 is electrically connected to the output terminal OUT2. Note that the transistor 301 controls connection between the input terminal IN1 or the output terminal OUT2 and a node B between the other terminal of the coil 304 and the cathode of the diode 303.

In the voltage control switching regulator 101 illustrated in FIG. 2B, a potential difference is generated between the input terminal IN1 and the input terminal IN2 when the transistor 301 is turned on, so that current flows through the coil 304 and energy is stored. The coil 304 is magnetized by the current flow, and electromotive force is generated by self induction in a direction opposite to the direction of current flow. Thus, the amount of current gradually increases.

Then, when the transistor 301 is turned off, a current path formed between the input terminal IN1 and the input terminal IN2 is blocked. The coil 304 generates electromotive force in a direction in which the change in current is blocked, that is, a direction which is opposite to the direction of electromotive force generated at the time when the transistor 301 is on. Thus, voltage based on current flowing through the coil 304 at the time when the transistor 301 is on is generated between the pair of terminals of the coil 304. Accordingly, the current flowing through the coil 304 is held by voltage generated between the terminals. In other words, when the transistor 301 is off, a current path is formed between the input terminal IN1 and the output terminal OUT1 through the diode 303 and the coil 304. At this time, voltage which is the sum of the input voltage applied to the input terminal IN1 and the voltage generated between the terminals of the coil 304 is applied to the output terminal OUT1, and the voltage is output from the voltage control switching regulator 101. Voltage corresponding to a difference between the voltage of the output terminal OUT1 and the fixed voltage is held between the terminals of the capacitor 305.

In the above operation, when the ratio of on time of the transistor 301 is high, the amount of current flowing through the coil 304 right before the transistor 301 is turned off increases. Thus, voltage generated between the terminals of the coil 304 is high when the transistor 301 is turned off, which allows voltage to increase so that a difference between output voltage and input voltage is increased. In contrast, when the ratio of off time of the transistor 301 is high, the amount of current flowing through the coil 304 right before the transistor 301 is turned off decreases. Thus, voltage generated between the terminals of the coil 304 is low when the transistor 301 is turned off, which allows voltage to increase so that a difference between output voltage and input voltage is decreased.

The coil 304 has a major role because the voltage control switching regulator 101 chops current by switching and converts the current into voltage as described above. Every time the transistor 301 that functions as a switching element is turned on or off, the amount of current flowing through the circuit is drastically changed. The coil 304 stores energy when the transistor 301 is turned on and current flows therethrough. The coil 304 releases the stored energy when the transistor 301 is turned off, and always generates electromotive force in a direction in which the change in current is blocked. Thus, power loss due to the on-resistance of the coil 304 which blocks the change in current can be substantially ignored. Accordingly, highly-efficient output voltage whose power conversion loss is small can be applied to the light-emitting element 103.

In other words, when the lighting device 100 illustrated in FIG. 1 includes the voltage control switching regulator 101, highly-efficient output voltage can be applied to the light-emitting element 103 with reference to voltage that is corrected to have an optimal level with a change in voltage of both the terminals of the monitor light-emitting element 104.

Thus, it is easy to take countermeasures against power loss in the lighting device 100. Consequently, the power conversion efficiency of the entire lighting device 100 is improved, so that power consumption can be reduced.

Note that in this specification, a first terminal is referred to as one of a source terminal and a drain terminal, and a second terminal is referred to as the other of the source terminal and the drain terminal.

Note that although FIGS. 2A and 2B each illustrate a structure in which only one transistor 301 that functions as a switching element is provided, the present invention is not limited to this structure. In one embodiment of the present invention, a plurality of transistors may function as one switching element. In the case where a plurality of transistors functioning as one switching element are provided, the plurality of transistors may be connected in parallel, in series, or in combination of parallel connection and series connection.

Note that in this specification, a state in which transistors are connected in series means, for example, a state in which only one of a first terminal and a second terminal of a first transistor is connected to only one of a first terminal and a second terminal of a second transistor. Further, a state in which transistors are connected in parallel means a state in which a first terminal of a first transistor is connected to a first terminal of a second transistor and a second terminal of the first transistor is connected to a second terminal of the second transistor.

Note that in this specification, the term "connection" means electrical connection and corresponds to a state in which current, voltage, or a potential can be supplied or transmitted. Accordingly, a connection state does not always mean a direct connection state but includes an indirect connection state through a circuit element such as a wiring, a resistor, a diode, or a transistor so that current, voltage, or a potential can be supplied or transmitted.

The terms "source terminal" and "drain terminal" of a transistor interchange with each other depending on the polarity of the transistor or a difference between levels of potentials applied to the terminals. In general, in an n-channel transistor, a terminal to which a low potential is applied is called a source terminal, and a terminal to which a high potential is applied is called a drain terminal. Further, in a p-channel transistor, a terminal to which a low potential is applied is called a drain terminal, and a terminal to which a high potential is applied is called a source terminal.

Note that switching of the transistor 301 may be performed by pulse width modulation (PWM) or pulse frequency modulation (PFM).

Next, the circuit structure and operation of the output voltage control circuit 106 at the time when pulse width modulation (PWM) is performed are described with reference to FIG. 3. Note that the output voltage control circuit 106 illustrated in FIG. 3 is only an example, and the structure of the output voltage control circuit 106 is not limited to this structure.

Figure 3:
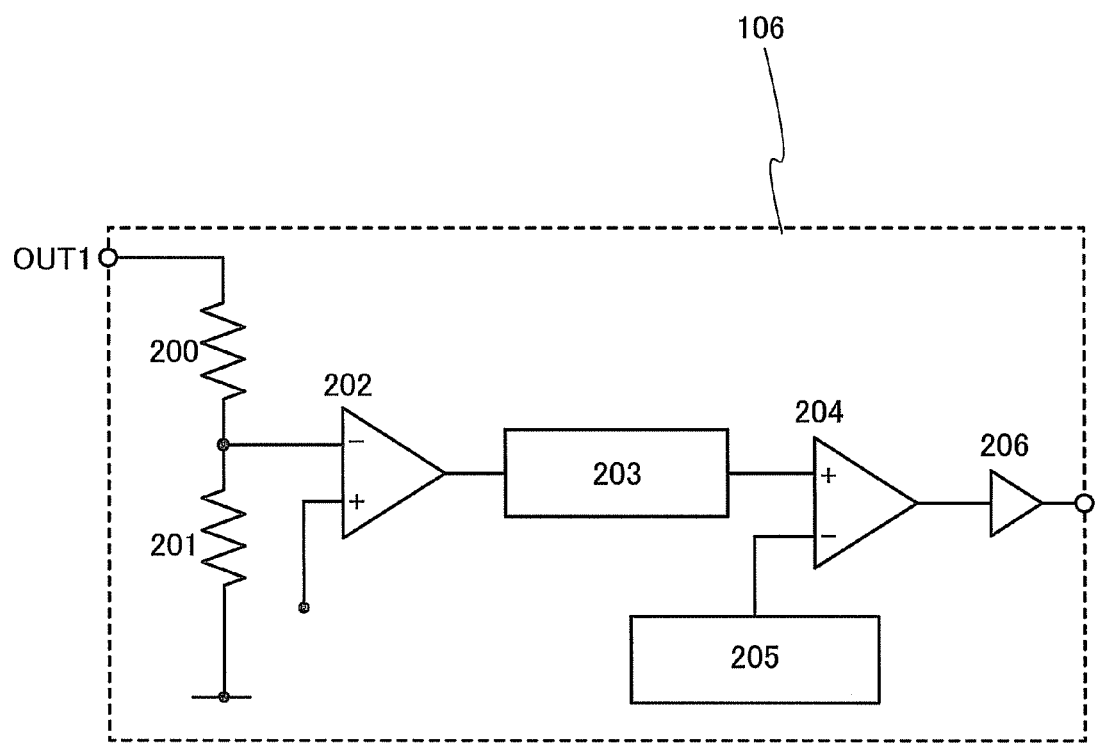
FIG. 3 is a circuit diagram illustrating a structure of a lighting device of the embodiment.

The output voltage control circuit 106 illustrated in FIG. 3 includes a resistor 200, a resistor 201, an error amplifier 202, a phase compensation circuit 203, a comparator 204, a triangle wave generator 205, and a buffer 206.

Voltage output from the output terminal OUT1 of the voltage control switching regulator 101 is applied to one terminal of the resistor 200. The other terminal of the resistor 200, one terminal of the resistor 201, an inversion input terminal (−) of the error amplifier 202 are electrically connected to each other. Fixed voltage such as GND is applied to the other terminal of the resistor 201. Thus, the voltage output from the output terminal OUT1 is divided by the resistor 200 and the resistor 201 and is applied to the inversion input terminal (−) of the error amplifier 202.

Voltage Vel that is corrected to have an optimal level with a change in voltage of both the terminals of the monitor light-emitting element 104 is applied to a non-inversion input terminal (+) of the error amplifier 202. The error amplifier 202 compares the voltage applied to the inversion input terminal (−) and the voltage Vel that is corrected to have an optimal level to each other, amplifies the difference, and outputs the amplified difference from an output terminal of the error amplifier 202.

The voltage output from the error amplifier 202 is applied to the phase compensation circuit 203. The phase compensation circuit 203 controls the phase of voltage output from the error amplifier 202. Thus, the voltage control switching regulator 101 can be prevented from oscillating, so that the operation of the voltage control switching regulator 101 can be stabilized.

Voltage output from the phase compensation circuit 203 is applied to a non-inversion input terminal (+) of the comparator 204. A triangle wave signal or a sawtooth signal which is output from the triangle wave generator 205 is applied to the inversion input terminal (−) of the comparator 204. The comparator 204 generates a rectangular wave signal which has a fixed period and has a pulse width changing in accordance with the level of voltage applied to the non-inversion input terminal (+). The rectangular wave signal output from the comparator 204 is output from the output voltage control circuit 106 to a gate terminal of the transistor 301 through the buffer 206.

The rectangular wave signal output from the output voltage control circuit 106 is used for switching of the transistor 301. As the on time of the transistor 301 becomes longer, the level of output voltage is increased. As the off time of the transistor 301 becomes longer, the level of output voltage is decreased. By control of the ratio of on time to off time, desired output voltage can be obtained from the voltage control switching regulator 101.

Next, the circuit structure and operation of the constant current circuit 102 are described with reference to FIG. 4. Note that the constant current circuit 102 illustrated in FIG. 4 is only an example, and the structure of the constant current circuit 102 is not limited to this structure.

Figure 4:
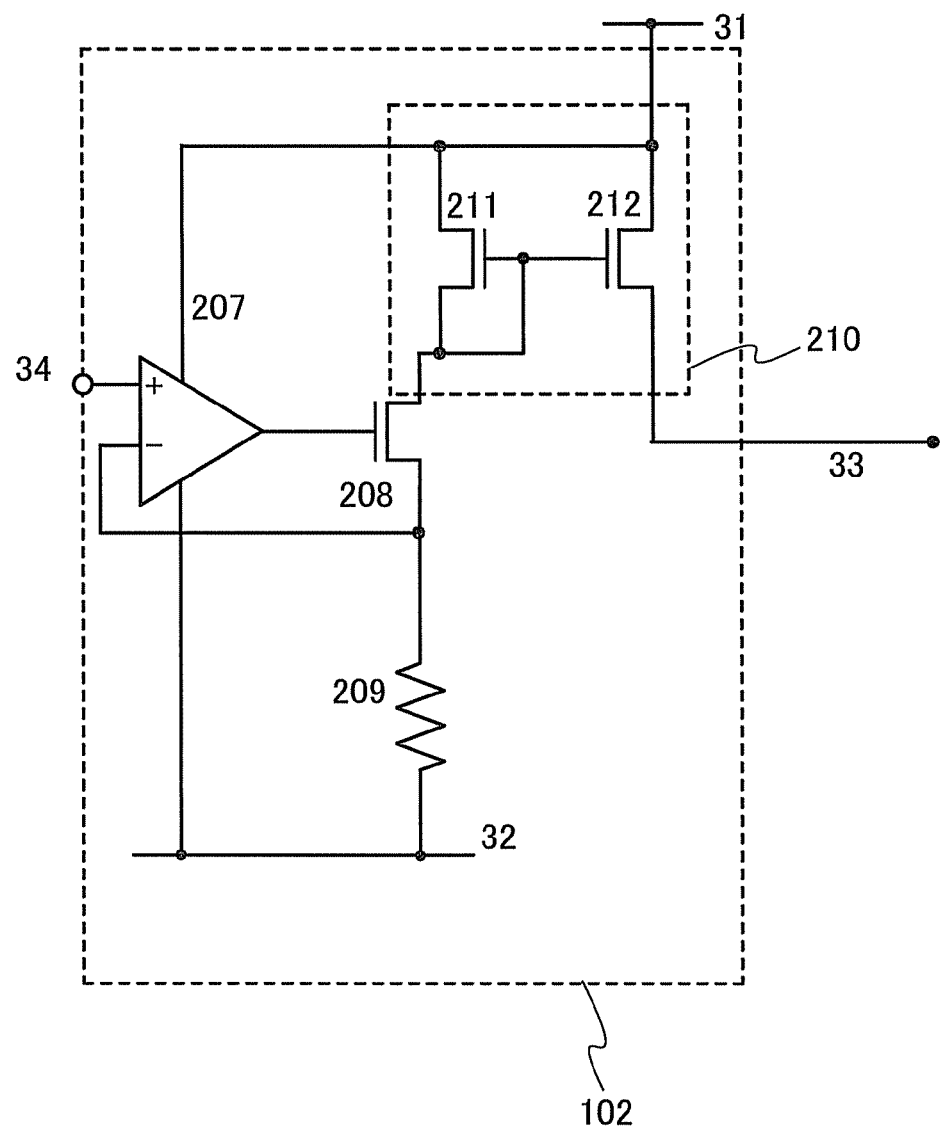
FIG. 4 is a circuit diagram illustrating a structure of a lighting device of the embodiment.

The constant current circuit 102 illustrated in FIG. 4 includes a current mirror circuit 210, an n-channel transistor 208, an amplifier 207, and a variable resistor 209. A first terminal of the n-channel transistor 208 is electrically connected to the current mirror circuit 210. A second terminal of the n-channel transistor 208 is electrically connected to one terminal of the variable resistor 209 and an inversion input terminal (−) of the amplifier 207. The first power supply line 31 is electrically connected to the current mirror circuit 210. The second power supply line 32 is electrically connected to the other terminal of the variable resistor 209. A fourth power supply line 34 is electrically connected to a non-inversion input terminal (+) of the amplifier 207.

The high power supply voltage $V_{DD}$ is applied to the first power supply line 31. The low power supply voltage $V_{SS}$ is applied to the second power supply line 32. The voltage Vel that is corrected to have an optimal level with a change in voltage of both the terminals of the monitor light-emitting element 104 is applied to the third power supply line 33. Predetermined voltage $V_{REF}$ (voltage that is lower than the high power supply voltage $V_{DD}$) is applied to the fourth power supply line 34. Note that the relation of the levels of $V_{DD}$ and $V_{REF}$ satisfies Vel<$V_{REF}$<$V_{DD}$. Fixed voltage such as GND is applied as $V_{SS}$ for simplification of description; however, this embodiment is not limited to this example. The magnitude relation between $V_{DD}$, $V_{REF}$, and Vel is changed depending on the case where which one of the pair of terminals is used as the anode and which one of the pair of terminals is used as the cathode in each of the light-emitting element 103 and the monitor light-emitting element 104. It is preferable to set the magnitude relation between $V_{DD}$, $V_{REF}$, and Vel as appropriate so that forward bias current flows through the light-emitting element 103 and the monitor light-emitting element 104.

The current mirror circuit 210 includes a first p-channel transistor 211 and a second p-channel transistor 212. Gate terminals of the first p-channel transistor 211 and the second p-channel transistor 212 in the current mirror circuit 210 are electrically connected to each other. A first terminal of the first p-channel transistor 211 is electrically connected to the gate terminals of the first p-channel transistor 211 and the second p-channel transistor 212. The high power supply voltage $V_{DD}$ is applied to second terminals of the first p-channel transistor 211 and the second p-channel transistor 212. The voltage Vel that is corrected to have an optimal level is applied to a first terminal of the second p-channel transistor 212.

Note that in this embodiment, the transistors in the current mirror circuit 210 of the constant current circuit 102 are p-channel transistors as illustrated in FIG. 4; however, n-channel transistors may be used.

Note that the light-emitting element 103 and the monitor light-emitting element 104 are preferably formed over one substrate in order to prevent variations in current-voltage characteristics of the light-emitting element 103 and the monitor light-emitting element 104.

In the case where current flows through the monitor light-emitting element 104 when the constant current circuit 102 is electrically connected to the one terminal of the monitor light-emitting element 104 in this manner, the value of the current is kept constant. In addition, the value of current flowing through the light-emitting element 103 and the value of current flowing through the monitor light-emitting element 104 can be made equal. The voltage Vel that is corrected to have an optimal level with a change in voltage of both the terminals of the monitor light-emitting element 104 is applied to the third power supply line 33. Accordingly, even in the case where the temperature of the light-emitting element 103 is raised by generation of heat due to internal resistance at the time of being driven and the lighting device 100 cannot radiate heat easily, fixed current can flow. When the lighting device 100 is dimmed in accordance with the current, desired luminance can be realized more surely. Thus, fluctuation in luminance of the light-emitting element and deterioration of the light-emitting element due to a change in temperature and a change over time can be suppressed, so that stable drive can be performed with high accuracy for a long time. Further, the power consumption of the entire lighting device 100 can be reduced.

When the driver portion 107 in the lighting device 100 includes the voltage control switching regulator 101 and the constant current circuit 102 as described above, a lighting device whose power conversion efficiency is improved and whose power consumption is reduced can be provided. Further, a lighting device which performs stable drive with high accuracy can be provided.

A lighting device with the above structure is one embodiment of the present invention, and the present invention includes a lighting device which is different from the lighting device.

This embodiment can be combined with any of the other embodiments as appropriate.

Embodiment 2

In this embodiment, circuit structures and operation of a lighting device according to one embodiment of the disclosed invention are described with reference to FIG. 5 and FIG. 6.

Figure 5:
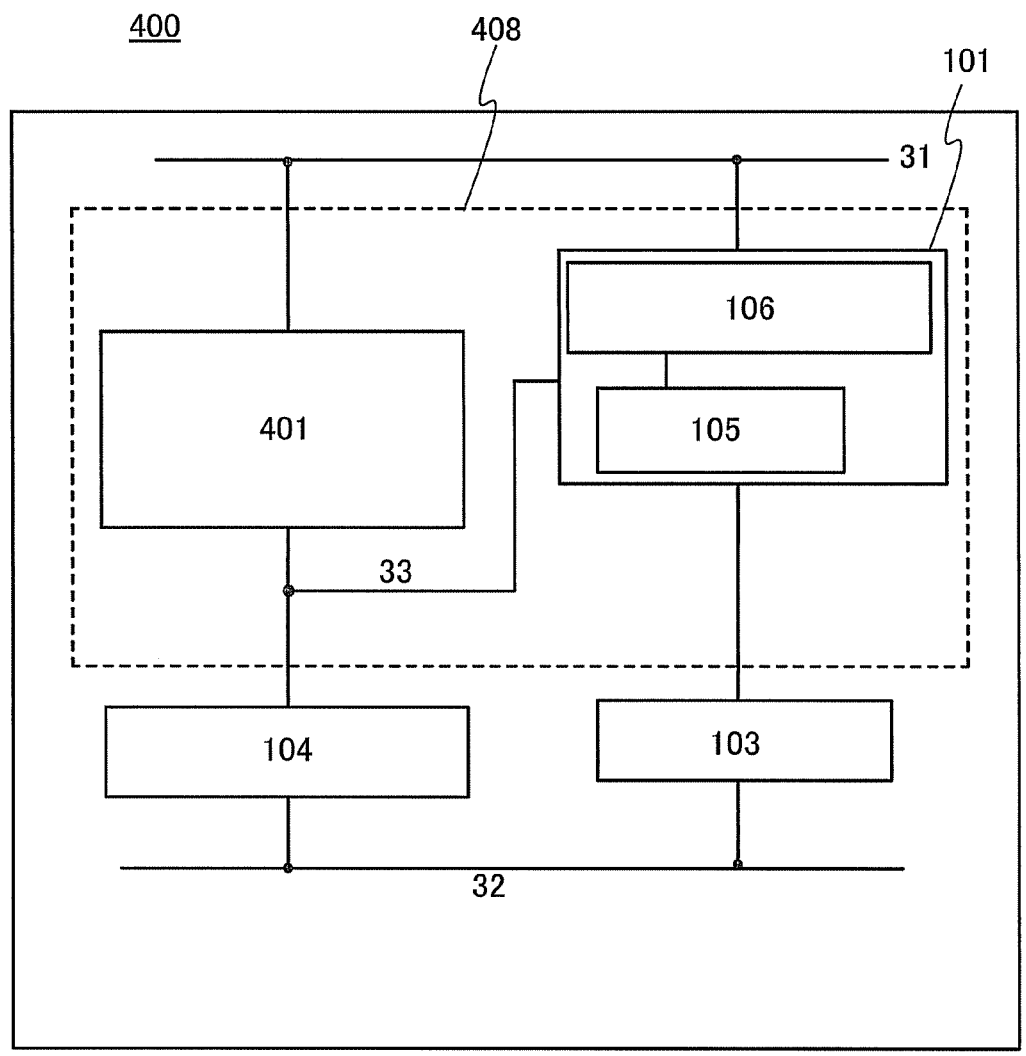
FIG. 5 is a circuit diagram illustrating a structure of a lighting device of an embodiment.

A lighting device 400 illustrated in FIG. 5 includes a driver portion 408 that includes the voltage control switching regulator 101 and a current control switching regulator 401, the light-emitting element 103, and the monitor light-emitting element 104.

The first power supply line 31 is electrically connected to the input terminal of the voltage control switching regulator 101 and an input terminal of the current control switching regulator 401. The one terminal of the light-emitting element 103 is electrically connected to the output terminal of the voltage control switching regulator 101. The other terminal of the light-emitting element 103 is electrically connected to the second power supply line 32. The one terminal of the monitor light-emitting element 104 is electrically connected to an output terminal of the current control switching regulator 401 and the third power supply line 33. The other terminal of the monitor light-emitting element 104 is electrically connected to the second power supply line 32. The high power supply voltage $V_{DD}$ is applied to the first power supply line 31, and the low power supply voltage $V_{SS}$ is applied to the second power supply line 32. The voltage Vel that is corrected to have an optimal level with a change in voltage of both the terminals of the monitor light-emitting element 104 is applied to the third power supply line 33. Note that here, fixed voltage such as GND is applied as the low power supply voltage $V_{SS}$ for simplification of description; however, this embodiment is not limited to this example.

Here, in the case where current flows through the monitor light-emitting element 104 when the output terminal of the current control switching regulator 401 is electrically connected to the one terminal of the monitor light-emitting element 104, the value of the current is kept constant. However, the temperature of the monitor light-emitting element 104 is changed over time. The current control switching regulator 401 can supply fixed stable current regardless of a change in temperature; thus, the voltage between both the terminals of the monitor light-emitting element 104 is changed while the value of current flowing through the monitor light-emitting element 104 is not changed. Specifically, the voltage of the other terminal of the monitor light-emitting element 104 is the fixed voltage and is not changed, so that the voltage of the one terminal of the monitor light-emitting element 104 is changed. The third power supply line 33 can detect this change and can apply the voltage that is corrected to have an optimal level to the voltage control switching regulator 101.

In addition, the current control switching regulator 401 can supply fixed stable current while an optimal current value is set in consideration of the state of each light-emitting element. In other words, a desired current value with respect to the light-emitting element 103 and the monitor light-emitting element 104 can be set more precisely. When the lighting device 400 is dimmed in accordance with the current, desired luminance can be realized more surely. Thus, fluctuation in luminance of the light-emitting element and deterioration of the light-emitting element due to a change in temperature and a change over time can be suppressed, so that stable drive can be performed with high accuracy for a long time. Further, the power consumption of the entire lighting device 400 can be reduced.

Next, the current control switching regulator 401 provided in the lighting device 400 illustrated in FIG. 5 is described with reference to FIG. 6. Note that the current control switching regulator 401 illustrated in FIG. 6 is only an example, and the structure of the current control switching regulator 401 is not limited to this structure.

Figure 6:
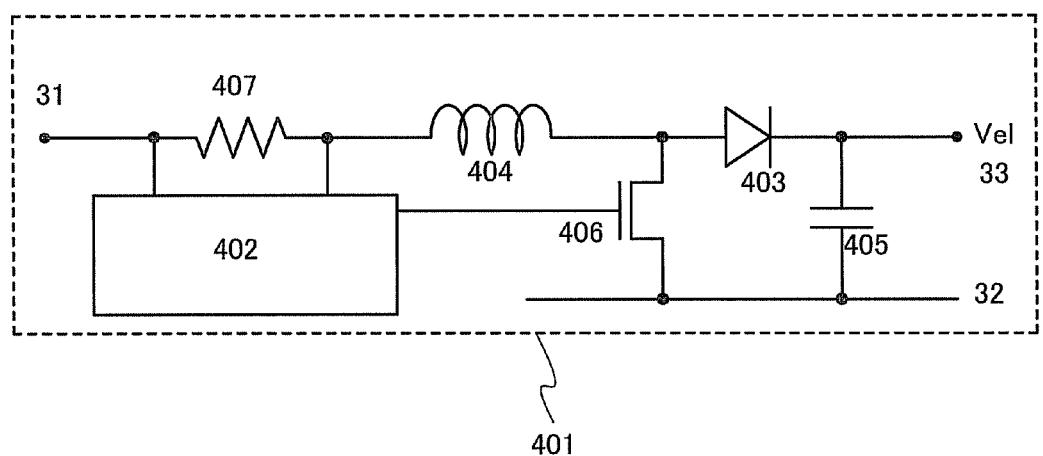
FIG. 6 is a circuit diagram illustrating a structure of a lighting device of the embodiment.

The current control switching regulator 401 illustrated in FIG. 6 includes an output current control circuit 402, a diode 403, a coil 404, a capacitor 405, a transistor 406, and a variable resistor 407.

One terminal of the variable resistor 407 and the first power supply line 31 are electrically connected to each other. One terminal of the coil 404 and the other terminal of the variable resistor 407 are electrically connected to each other. Both the terminals of the variable resistor 407 and the output current control circuit 402 are electrically connected to each other. The output current control circuit 402 is electrically connected to a gate terminal of the transistor 406. A first terminal of the transistor 406 is electrically connected to the other terminal of the coil 404 and an anode of the diode 403. A second terminal of the transistor 406 is electrically connected to the second power supply line 32. One terminal of the capacitor 405 is electrically connected to a cathode of the diode 403 and the third power supply line 33. The other terminal of the capacitor 405 is electrically connected to the second power supply line 32. Note that the transistor 406 controls connection between the one terminal of the coil 404 and the anode of the diode 403, and connection between the first power supply line 31 and the second power supply line 32.

In the current control switching regulator 401 illustrated in FIG. 6, a potential difference is generated between the first power supply line 31 and the second power supply line 32 when the transistor 406 is turned on, so that current flows through the coil 404 and energy is stored. The coil 404 is magnetized by the current flow, and electromotive force is generated by self induction in a direction opposite to the direction of current flow. Thus, the amount of current gradually increases.

Then, when the transistor 406 is turned off, a current path formed between the first power supply line 31 and the second power supply line 32 is blocked. The coil 404 generates electromotive force in a direction in which the change in current is blocked, that is, a direction which is opposite to the direction of electromotive force generated at the time when the transistor 406 is on. Thus, voltage based on current flowing through the coil 404 at the time when the transistor 406 is on is generated between the pair of terminals of the coil 404. Accordingly, the current flowing through the coil 404 is held by voltage generated between the terminals. In other words, when the transistor 406 is off, a current path is formed between the first power supply line 31 and the third power supply line 33 through the diode 403 and the coil 404. At this time, voltage which is the sum of the voltage applied to the first power supply line 31 and the voltage generated between the terminals of the coil 404 is applied to the third power supply line 33, and the voltage is output from the current control switching regulator 401. Voltage corresponding to a difference between the voltage of the third power supply line 33 and the fixed voltage is held between the terminals of the capacitor 405.

In the current control switching regulator 401, output current is converted into voltage by the variable resistor 407, and voltage generated in both the terminals of the variable resistor 407 is fed back to the output current control circuit 402, so that output current is controlled. A rectangular wave signal output from the output current control circuit 402 is used for switching of the transistor 406 so that the ratio of on time and off time of the transistor 406 is controlled. As the on time of the transistor 406 becomes longer, the level of output voltage is increased. As the off time of the transistor 406 becomes longer, the level of output voltage is decreased. By control of the ratio of on time to off time, output voltage can be stabilized and desired voltage can be obtained.

The coil 404 has a major role because the current control switching regulator 401 chops current by switching and converts the current into voltage as described above. Every time the transistor 406 that functions as a switching element is turned on or off, the amount of current flowing through the circuit is drastically changed. The coil 404 stores energy when the transistor 406 is turned on and current flows therethrough. The coil 404 releases the stored energy when the transistor 406 is turned off, and always generates electromotive force in a direction in which the change in current is blocked. Thus, power loss due to the on-resistance of the coil 404 which blocks the change in current can be substantially ignored. Accordingly, highly-efficient constant current whose power conversion loss is small can be supplied to the light-emitting element 103 and the monitor light-emitting element 104.

Accordingly, when the lighting device 400 illustrated in FIG. 5 includes the current control switching regulator 401, it is possible to detect a change in current more sensitively and adjust the value of current detection resistance. Thus, an optimal current value with respect to the light-emitting element 103 and the monitor light-emitting element 104 can be set. Consequently, current can be controlled more stably. Efficiency of the lighting device 400 can be further increased and power loss can be further reduced when output current which is controlled by the current control switching regulator 401 and output voltage that is efficiently extracted with reference to voltage corrected to have an optimal level with a change in voltage of both the terminals of the monitor light-emitting element 104 are applied to the light-emitting element 103. Accordingly, the power conversion efficiency of the entire lighting device 400 is improved, so that power consumption can be reduced.

Note that in the disclosed invention, the high power supply voltage $V_{DD}$ is applied to the first power supply line 31. The low power supply voltage $V_{SS}$ is applied to the second power supply line 32. The voltage Vel that is corrected to have an optimal level with a change in voltage of both the terminals of the monitor light-emitting element 104 is applied to the third power supply line 33. The predetermined voltage $V_{REF}$ (the voltage that is lower than the high power supply voltage $V_{DD}$) is applied to the fourth power supply line 34. Further, Vel refers to voltage applied to a terminal whose voltage is changed in the monitor light-emitting element 104. Note that the relation of the levels of $V_{DD}$ and $V_{REF}$ satisfies Vel<$V_{REF}$<$V_{DD}$. Fixed voltage such as GND is applied as $V_{SS}$ for simplification of description; however, this embodiment is not limited to this example.

Note that in this embodiment, the transistor in the current control switching regulator 401 may be either an n-channel transistor or a p-channel transistor as illustrated in FIG. 6.

In the case where current flows through the monitor light-emitting element 104 when the current control switching regulator 401 is electrically connected to the one terminal of the monitor light-emitting element 104 in this manner, the value of the current is kept constant. In addition, the value of current flowing through the light-emitting element 103 and the value of current flowing through the monitor light-emitting element 104 can be made equal. The voltage Vel that is corrected to have an optimal level with a change in voltage of both the terminals of the monitor light-emitting element 104 is applied to the third power supply line 33. Accordingly, even in the case where the temperature of the light-emitting element is raised by generation of heat due to internal resistance at the time of being driven and the lighting device 400 cannot radiate heat easily, fixed current can flow by setting an optimal current value in consideration of the characteristics of each light-emitting element. When the lighting device 400 is dimmed in accordance with the current, desired luminance can be realized more surely and current can be controlled more stably. Thus, fluctuation in luminance of the light-emitting element and deterioration of the light-emitting element due to a change in temperature and a change over time can be suppressed, so that stable drive can be performed with high accuracy for a long time. Further, the power consumption of the entire lighting device 400 can be reduced.

When the driver portion 408 in the lighting device 400 includes the voltage control switching regulator 101 and the current control switching regulator 401 as described above, a lighting device whose power conversion efficiency is improved and whose power consumption is reduced can be provided. Further, a lighting device which performs stable drive with high accuracy can be provided.

This embodiment can be combined with any of the other embodiments as appropriate.

Embodiment 3

Figure 8A:
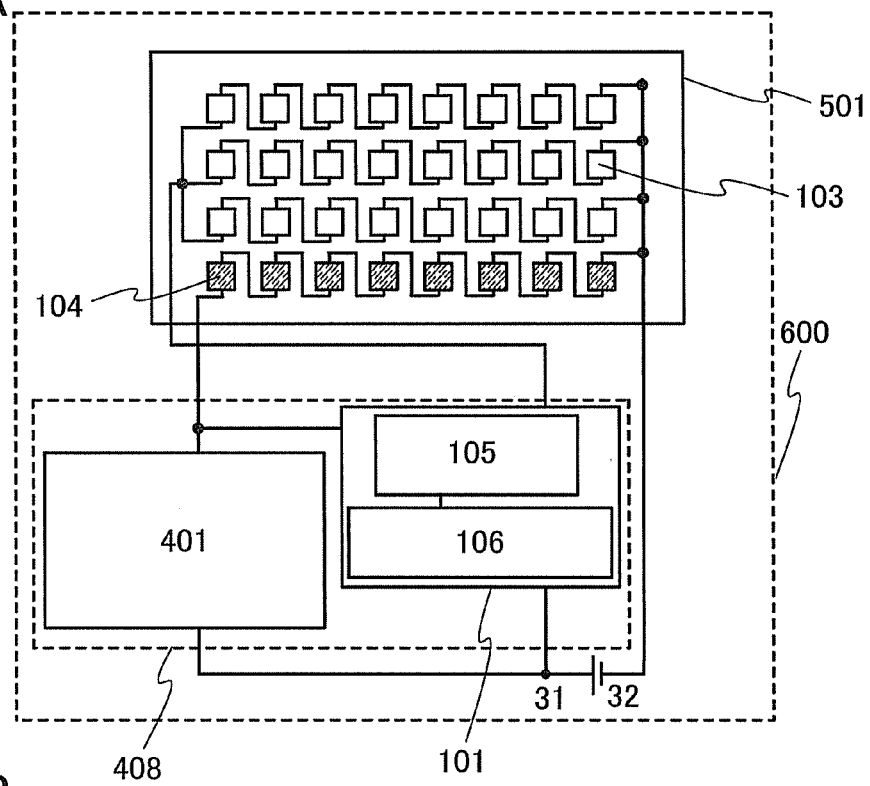
FIGS. 8A and 8B are circuit diagrams each illustrating a structure of a lighting device of the embodiment.
Figure 8B:
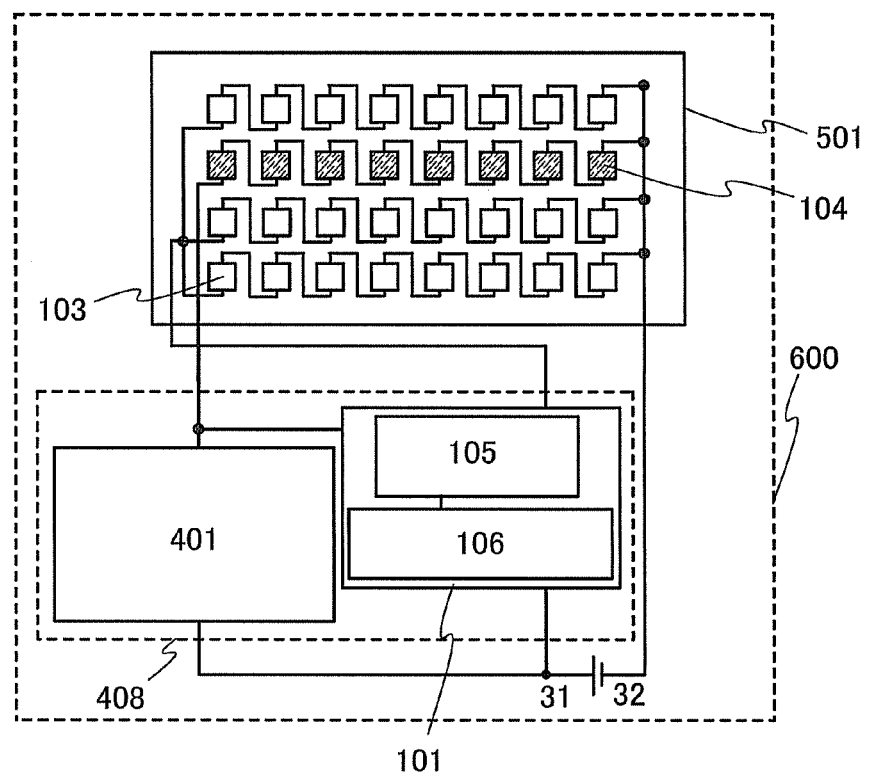

FIGS. 7A and 7B and FIGS. 8A and 8B are schematic plan views of the entire lighting device 500 according to the disclosed invention. FIGS. 7A and 7B are schematic plan views of the lighting device in which light-emitting elements are connected in parallel. FIGS. 8A and 8B are schematic plan views of the lighting device in which light-emitting elements are connected in series. Note that the light-emitting elements in the lighting device 500 are separately provided so that structures and connection relations of the light-emitting elements are easily understood. In each light-emitting element, an upper portion in the diagram corresponds to a cathode, and a lower portion in the diagram corresponds to an anode.

In FIGS. 7A and 7B, a substrate 501 includes the plurality of light-emitting elements 103 and the plurality of monitor light-emitting elements 104. Note that the number of the monitor light-emitting elements 104 is smaller than the number of the light-emitting elements 103. The plurality of light-emitting elements 103 are connected to each other in parallel over the substrate 501. The anode of each of the light-emitting elements 103 is electrically connected to the output terminal of the voltage control switching regulator 101. The cathode of each of the light-emitting elements 103 is electrically connected to the second power supply line 32. The plurality of monitor light-emitting elements 104 are connected to each other in parallel over the substrate 501. The anode of each of the monitor light-emitting elements 104 is electrically connected to the constant current circuit 102. The cathode of each of the monitor light-emitting elements 104 is electrically connected to the second power supply line 32. The first power supply line 31 is electrically connected to the input terminal of the voltage control switching regulator 101 and the constant current circuit 102.

The lighting device 500 illustrated in FIGS. 7A and 7B has a structure where the plurality of light-emitting elements 103 are connected to the plurality of monitor light-emitting elements 104 in parallel; thus, the cathodes of the light-emitting elements can be shared. Thus, it is possible to avoid complex wirings or complexity of leading and connection of cables, so that the power consumption of the lighting device 500 can be reduced. In addition, since power can be stably supplied to each light-emitting element, there is a low possibility of short-circuit of each light-emitting element. Further, even when light emission is not performed due to short-circuit of some light-emitting elements, the function of the lighting device 500 does not markedly decrease.

Note that when the plurality of light-emitting elements 103 and the plurality of monitor light-emitting elements 104 are provided over the substrate 501, variations in current-voltage characteristics of the light-emitting elements 103 and the monitor light-emitting elements 104 can be suppressed.

As illustrated in FIGS. 7A and 7B, in the lighting device 500 according to the present invention, the monitor light-emitting elements 104 may be provided over any portion of the substrate 501. For example, as illustrated in FIG. 7A, the monitor light-emitting elements 104 may be provided in a line at an end of the substrate 501. As illustrated in FIG. 7B, the monitor light-emitting elements 104 may be provided in a line in the center of the substrate 501. In the lighting device 500, when the monitor light-emitting elements 104 are provided in the center of the substrate 501, changes in voltage of both the terminals of the monitor light-emitting element 104 can be detected averagely in a wide area. Thus, it is easy to control the luminance of the light-emitting elements 103 in the entire substrate 501 more precisely. Voltage which is corrected to have a more optimal level for the lighting device 500 can be applied to the voltage control switching regulator 101; thus, power loss can be suppressed.

Alternatively, the monitor light-emitting elements 104 may be provided sparsely over the entire substrate 501. In that case, changes in voltage of both the terminals of the monitor light-emitting element 104 can be detected averagely in a wider area.

Light emission of the monitor light-emitting elements 104 can be more scattered in the case where the monitor light-emitting elements 104 are provided sparsely over the entire substrate 501 as compared to the case where the monitor light-emitting elements 104 are provided in a line over the entire substrate 501. In either case, the number of the monitor light-emitting elements 104 is smaller than the number of the light-emitting elements 103. Thus, even when the monitor light-emitting elements 104 deteriorate due to a change in temperature or a change over time and the luminance of the monitor light-emitting elements 104 slightly decrease, the balance of light emission in the monitor light-emitting elements 104 for a lighting purpose does not markedly break down. Accordingly, without the wastes of the monitor light-emitting elements 104, it is easy to perform stable drive with high accuracy for a long time. Further, the power consumption of the entire lighting device 500 can be reduced.

In FIGS. 8A and 8B, the substrate 501 includes the plurality of light-emitting elements 103 and the plurality of monitor light-emitting elements 104. Note that the number of the monitor light-emitting elements 104 is smaller than the number of the light-emitting elements 103. The plurality of light-emitting elements 103 are connected to each other in series over the substrate 501. The anode of each of the light-emitting elements 103 is electrically connected to the output terminal of the voltage control switching regulator 101. The cathode of each of the light-emitting elements 103 is electrically connected to the second power supply line 32. The plurality of monitor light-emitting elements 104 are connected to each other in series over the substrate 501. The anode of each of the monitor light-emitting elements 104 is electrically connected to the output terminal of the current control switching regulator 401. The cathode of each of the monitor light-emitting elements 104 is electrically connected to the second power supply line 32. The first power supply line 31 is electrically connected to the input terminal of the voltage control switching regulator 101 and the input terminal of the current control switching regulator 401.

A lighting device 600 illustrated in FIGS. 8A and 8B has a structure where the plurality of light-emitting elements 103 are connected to the plurality of monitor light-emitting elements 104 in series; thus, the number of wirings can be reduced. In addition, even when one light-emitting element 103 (one monitor light-emitting element 104) is short-circuited and does not emit light, the light-emitting element 103 (the monitor light-emitting element 104) can be regarded as being eliminated from the equivalent circuit; thus, current can flow through the normal light-emitting elements 103 (the normal monitor light-emitting elements 104) other than the short-circuited light-emitting element. Accordingly, there is an extremely low possibility that all the light-emitting elements 103 (all the monitor light-emitting elements 104) do not emit light, so that the lighting device 600 can be lit for a long time.

Note that when the plurality of light-emitting elements 103 and the plurality of monitor light-emitting elements 104 are provided over the substrate 501, variations in current-voltage characteristics of the light-emitting elements 103 and the monitor light-emitting elements 104 can be suppressed.

As illustrated in FIGS. 8A and 8B, in the lighting device 600 according to the present invention, the monitor light-emitting elements 104 may be provided over any portion of the substrate 501. For example, as illustrated in FIG. 8A, the monitor light-emitting elements 104 may be provided in a line at an end of the substrate 501. As illustrated in FIG. 8B, the monitor light-emitting elements 104 may be provided in a line in the center of the substrate 501.

Note that in FIGS. 7A and 7B and FIGS. 8A and 8B each illustrate a structure of a lighting device in which all the plurality of light-emitting elements 103 and all the plurality of monitor light-emitting elements 104 are electrically connected in similar connection relations; however, the disclosed invention is not limited to this structure. A structure of a lighting device in which the plurality of light-emitting elements 103 are connected to each other in series (or in parallel) and the plurality of monitor light-emitting elements 104 are connected to each other in parallel (or in series) may be employed. Note that the plurality of light-emitting elements 103 should be connected to each other in the same connection relations and the plurality of monitor light-emitting elements 104 should be connected to each other in the same connection relations.

With such a structure, the power conversion efficiency of the lighting device can be improved and the power consumption of the lighting device can be reduced. Further, fluctuation in luminance of the light-emitting element and deterioration of the light-emitting element due to a change in temperature and a change over time can be suppressed, so that stable drive can be performed with high accuracy.

This embodiment can be combined with any of the other embodiments as appropriate.

Embodiment 4

Various aspects of a lighting device according to the disclosed invention are described. The lighting device according to the disclosed invention can be applied to various display devices and electronic devices (including game machines).

Figure 9:
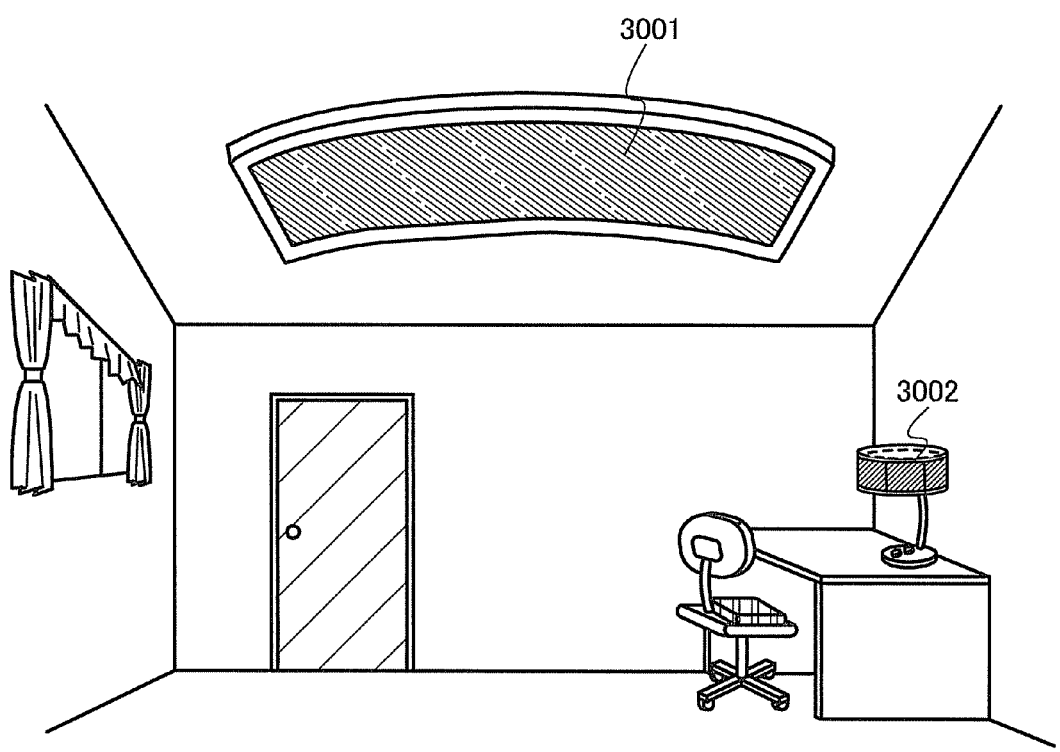
FIG. 9 illustrates examples of lighting devices.

FIG. 9 is an example in which the lighting device formed in accordance with the above embodiment is used as indoor lighting equipment 3001 and 3002. The lighting equipment 3001 is attached to the ceiling. With provision of the lighting device formed in accordance with the above embodiment over a thin glass substrate, the lighting device can be used as the flexible desktop lighting equipment 3002. With the use of a glass substrate, deterioration of the lighting device due to a change in temperature and a change over time can be suppressed. In particular, in the case where the lighting device is used as residential lighting equipment, the lighting equipment can be put but not be projected in a wall, a ceiling, or a floor. Note that the lighting equipment includes, in its category, wall-hanging lighting equipment, lighting equipment in a car, an evacuation light, and the like in addition to lighting equipment attached to the ceiling and desktop lighting equipment. The size of the lighting device described in the above embodiment can be increased. Even when the size of the lighting device is increased, power consumption can be reduced while uniform brightness is obtained in a plane.

Figure 10A:
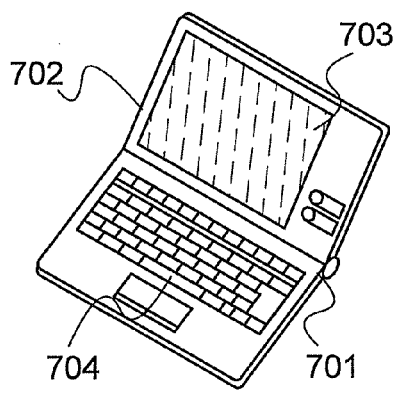
FIGS. 10A to 10D illustrate examples of electronic devices.

FIG. 10A illustrates a laptop, which includes a housing 701, a housing 702, a display portion 703, a keyboard 704, and the like. In the laptop, the display portion 703 is a transmissive liquid crystal display and includes the lighting device formed in accordance with the above embodiment as a backlight. Since the lighting device in which fluctuation in luminance and deterioration of a light-emitting element are suppressed and stable operation can be performed with high accuracy is included, uniform brightness can be obtained in a plane of the display portion 703. Further, a laptop with sufficiently low power consumption is realized.

Figure 10C:
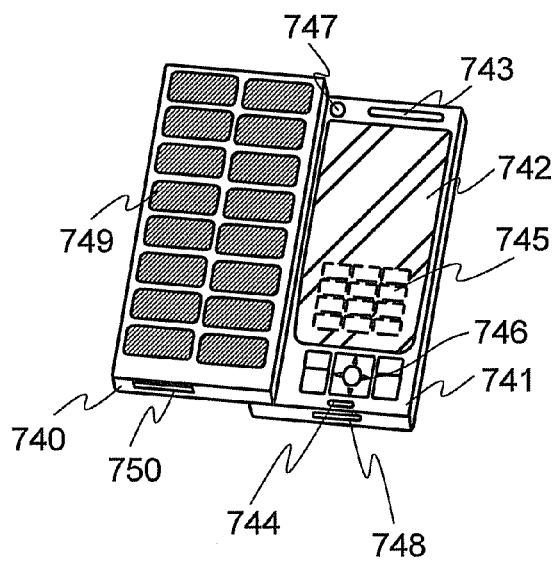
Figure 10B:
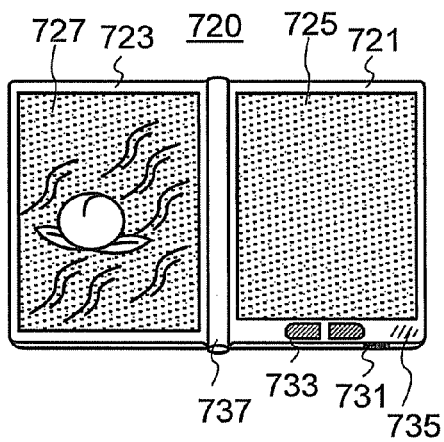

FIG. 10B is an e-book reader 720 provided with electronic paper. The e-book reader 720 has two housings 721 and 723. The housing 721 and the housing 723 include a display portion 725 and a display portion 727, respectively. The housings 721 and 723 are connected to each other by a hinge 737 and can be opened or closed with the hinge 737 used as an axis. The housing 721 is provided with a power switch 731, operation keys 733, a speaker 735, and the like. At least one of the display portions 725 and 727 is a transmissive liquid crystal display and includes the lighting device formed in accordance with the above embodiment as a backlight. Since the lighting device in which fluctuation in luminance and deterioration of a light-emitting element are suppressed and stable operation can be performed with high accuracy is included, uniform brightness can be obtained in a plane of the display portion 725 and a plane of the display portion 727. Further, an e-book reader with sufficiently low power consumption is realized.

FIG. 10C illustrates a cellular phone, which includes two housings 740 and 741. Further, the housing 740 and the housing 741 which are developed as illustrated in FIG. 10C can overlap with each other by sliding; thus, the size of the cellular phone can be decreased, which makes the cellular phone suitable for being carried. The housing 741 includes a display panel 742, a speaker 743, a microphone 744, operation keys 745, a pointing device 746, a camera lens 747, an external connection terminal 748, and the like. The housing 740 includes a solar cell 749 for storing electricity in the cellular phone, an external memory slot 750, and the like. In addition, an antenna is incorporated in the housing 741. The display panel 742 is a transmissive liquid crystal display and includes the lighting device formed in accordance with the above embodiment as a backlight. Since the lighting device in which fluctuation in luminance and deterioration of a light-emitting element are suppressed and stable operation can be performed with high accuracy is included, uniform brightness can be obtained in a plane of the display panel 742. Further, a cellular phone with sufficiently low power consumption is realized.

Figure 10D:
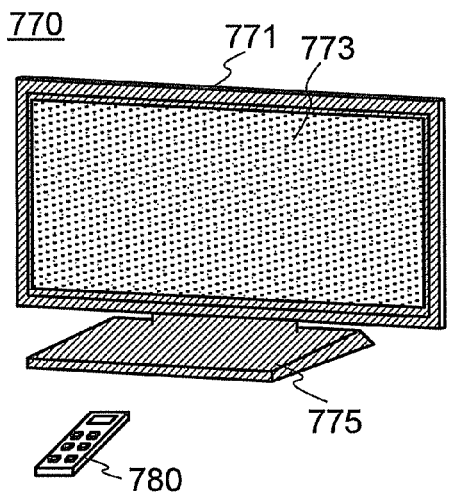

FIG. 10D illustrates a television set 770, which includes a housing 771, a display portion 773, a stand 775, and the like.

The television set 770 can be operated with an operation switch of the housing 771 or a remote control 780. In the television set 770, the display portion 773 is a transmissive liquid crystal display and includes the lighting device formed in accordance with the above embodiment as a backlight. Since the lighting device in which fluctuation in luminance and deterioration of a light-emitting element are suppressed and stable operation can be performed with high accuracy is included, uniform brightness can be obtained in a plane of the display portion 773 and vivid images can be seen in the television set 770 even in a daytime bright room. In addition, the size of the lighting device can be increased, and uniform brightness can be obtained in the plane of the display portion 773 even when the size of the lighting device is increased. Further, a television set with sufficiently low power consumption is realized.

As described above, the lighting equipment and the electronic devices described in this embodiment each include the lighting device according to any of the above embodiments. Thus, it is possible to realize lighting equipment and an electronic device whose power consumption is reduced and whose reliability is improved.

This application is based on Japanese Patent Application serial No. 2010-184846 filed with Japan Patent Office on Aug. 20, 2010, the entire contents of which are hereby incorporated by reference.

What is claimed is:

1. A lighting device comprising:
   a first light-emitting element;
   a second light-emitting element;
   a circuit configured to perform constant current drive on the first light-emitting element and the second light-emitting element; and
   a switching regulator configured to detect a voltage generated in the second light-emitting element and configured to output the voltage,
   wherein a first terminal of the first light-emitting element and an output terminal of the switching regulator are electrically connected to each other,
   wherein a first terminal of the second light-emitting element and the circuit are electrically connected to each other, and
   wherein a second terminal of the first light-emitting element is electrically connected to a second terminal of the second light-emitting element.

2. The lighting device according to claim 1,
   wherein an input terminal of the switching regulator and the circuit are electrically connected to a wiring for supplying a high power supply potential.

3. The lighting device according to claim 1,
   wherein the second terminal of the first light-emitting element and the second terminal of the second light-emitting element are electrically connected to a wiring for supplying a low power supply potential.

4. The lighting device according to claim 1, further comprising a plurality of first light-emitting elements,
   wherein each of the plurality of first light-emitting elements is the first light-emitting element.

5. The lighting device according to claim 1, further comprising a plurality of second light-emitting elements,
   wherein each of the plurality of second light-emitting elements is the second light-emitting element.

6. The lighting device according to claim 1, further comprising:
   a plurality of first light-emitting elements; and
   a plurality of second light-emitting elements, wherein each of the plurality of first light-emitting elements is the first light-emitting element,
wherein each of the plurality of second light-emitting elements is the second light-emitting element, and
wherein the number of the plurality of second light-emitting elements is smaller than the number of the plurality of first light-emitting elements.

7. The lighting device according to claim 1,
wherein the first light-emitting element and the second light-emitting element are formed over the same substrate.

8. The lighting device according to claim 1,
wherein the first light-emitting element and the second light-emitting element are EL elements.

9. The lighting device according to claim 1, further comprising:
a plurality of first light-emitting elements; and
a plurality of second light-emitting elements,
wherein each of the plurality of first light-emitting elements is the first light-emitting element,
wherein each of the plurality of second light-emitting elements is the second light-emitting element,
wherein the plurality of first light-emitting elements are connected to each other in parallel, and
wherein the plurality of second light-emitting elements are connected to each other in parallel.

10. The lighting device according to claim 1, further comprising:
a plurality of first light-emitting elements; and
a plurality of second light-emitting elements,
wherein each of the plurality of first light-emitting elements is the first light-emitting element,
wherein each of the plurality of second light-emitting elements is the second light-emitting element,
wherein the plurality of first light-emitting elements are connected to each other in series, and
wherein the plurality of second light-emitting elements are connected to each other in series.

11. The lighting device according to claim 1,
wherein the switching regulator comprising:
an output voltage control circuit comprising a transistor, a diode, a coil, and a capacitor; and
a power converter circuit comprising a resistor, an error amplifier, a phase compensation circuit, a comparator, a triangle wave generator, and a buffer.

12. A display device comprising the lighting device according to claim 1 in a display portion.

13. A display device comprising the lighting device according to claim 1 in a backlight portion.

14. An electronic device comprising the lighting device according to claim 1 in a display portion.

15. An electronic device comprising the lighting device according to claim 1 in a backlight portion.

16. A lighting device comprising:
a first light-emitting element;
a second light-emitting element;
a first switching regulator configured to perform constant current drive on the first light-emitting element and the second light-emitting element; and
a second switching regulator configured to detect a voltage generated in the second light-emitting element and configured to output the voltage,
wherein a first terminal of the first light-emitting element and an output terminal of the second switching regulator are electrically connected to each other,
wherein a first terminal of the second light-emitting element and an output terminal of the first switching regulator are electrically connected to each other, and
wherein a second terminal of the first light-emitting element is electrically connected to a second terminal of the second light-emitting element.

17. The lighting device according to claim 16,
wherein an input terminal of the first switching regulator and an input terminal of the second switching regulator are electrically connected to a wiring for supplying a high power supply potential.

18. The lighting device according to claim 16,
wherein the second terminal of the first light-emitting element and the second terminal of the second light-emitting element are electrically connected to a wiring for supplying a low power supply potential.

19. The lighting device according to claim 16, further comprising a plurality of first light-emitting elements,
wherein each of the plurality of first light-emitting elements is the first light-emitting element.

20. The lighting device according to claim 16, further comprising a plurality of second light-emitting elements,
wherein each of the plurality of second light-emitting elements is the second light-emitting element.

21. The lighting device according to claim 16, further comprising:
a plurality of first light-emitting elements; and
a plurality of second light-emitting elements,
wherein each of the plurality of first light-emitting elements is the first light-emitting element,
wherein each of the plurality of second light-emitting elements is the second light-emitting element, and
wherein the number of the plurality of second light-emitting elements is smaller than the number of the plurality of first light-emitting elements.

22. The lighting device according to claim 16,
wherein the first light-emitting element and the second light-emitting element are formed over a same substrate.

23. The lighting device according to claim 16,
wherein the first light-emitting element and the second light-emitting element are EL elements.

24. The lighting device according to claim 16, further comprising:
a plurality of first light-emitting elements; and
a plurality of second light-emitting elements,
wherein each of the plurality of first light-emitting elements is the first light-emitting element,
wherein each of the plurality of second light-emitting elements is the second light-emitting element,
wherein the plurality of first light-emitting elements are connected to each other in parallel, and
wherein the plurality of second light-emitting elements are connected to each other in parallel.

25. The lighting device according to claim 16, further comprising:
a plurality of first light-emitting elements; and
a plurality of second light-emitting elements,
wherein each of the plurality of first light-emitting elements is the first light-emitting element,
wherein each of the plurality of second light-emitting elements is the second light-emitting element,
wherein the plurality of first light-emitting elements are connected to each other in series, and
wherein the plurality of second light-emitting elements are connected to each other in series.

26. The lighting device according to claim 16,
wherein the second switching regulator comprising:
an output voltage control circuit comprising a transistor, a diode, a coil, and a capacitor; and
a power converter circuit comprising a resistor, an error amplifier, a phase compensation circuit, a comparator, a triangle wave generator, and a buffer.

27. A display device comprising the lighting device according to claim 16 in a display portion.

28. A display device comprising the lighting device according to claim 16 in a backlight portion.

29. An electronic device comprising the lighting device according to claim 16 in a display portion.

30. An electronic device comprising the lighting device according to claim 16 in a backlight portion.

31. A lighting device comprising:
a first power supply line;
a second power supply line;
a plurality of first light-emitting elements on a substrate;
a plurality of second light-emitting elements on the substrate; and
a driver portion electrically connected to the first power supply line, the driver portion comprising a switching regulator configured to detect a voltage generated in the plurality of second light-emitting elements and configured to output the voltage to the plurality of first light-emitting elements,
wherein the number of the plurality of second light-emitting elements is smaller than the number of the plurality of first light-emitting elements,
wherein anodes of the plurality of first light-emitting elements and anodes of the plurality of second light-emitting elements are electrically connected to the driver portion,
wherein cathodes of the plurality of first light-emitting elements and cathodes of the plurality of second light-emitting elements are electrically connected to the second power supply line, and
wherein the cathodes of the plurality of first light-emitting elements are electrically connected to the cathodes of the plurality of second light-emitting elements.

32. The lighting device according to claim 31,
wherein the plurality of first light-emitting elements are connected to each other in parallel, and
wherein the plurality of second light-emitting elements are connected to each other in parallel.

33. The lighting device according to claim 31,
wherein the plurality of first light-emitting elements are connected to each other in series, and
wherein the plurality of second light-emitting elements are connected to each other in series.

34. The lighting device according to claim 31,
wherein the substrate is a flexible substrate.

35. The lighting device according to claim 31,
wherein the driver portion further comprises a switching regulator configured to perform constant current drive on the plurality of first light-emitting elements and the plurality of second light-emitting elements.

36. The lighting device according to claim 31,
wherein the driver portion further comprises a circuit configured to perform constant current drive on the plurality of first light-emitting elements and the plurality of second light-emitting elements.

* * * * *